United States Patent
Ben Artsi

(10) Patent No.: US 9,921,596 B2
(45) Date of Patent: Mar. 20, 2018

(54) POWER SUPPLY NOISE REDUCTION CIRCUIT AND POWER SUPPLY NOISE REDUCTION METHOD

(71) Applicant: Marvell Israel (M.I.S.L) Ltd., Yokneam (IL)

(72) Inventor: Liav Ben Artsi, Nahariya (IL)

(73) Assignee: MARVELL ISRAEL (M.I.S.L) LTD, Yokneam (IL)

( * ) Notice: Subject to any disclaimer, the term of this patent is extended or adjusted under 35 U.S.C. 154(b) by 444 days.

(21) Appl. No.: 14/575,334

(22) Filed: Dec. 18, 2014

(65) Prior Publication Data

US 2015/0177773 A1  Jun. 25, 2015

Related U.S. Application Data

(60) Provisional application No. 61/920,166, filed on Dec. 23, 2013.

(51) Int. Cl.
*H02H 9/00* (2006.01)
*G05F 1/613* (2006.01)
*G11C 5/14* (2006.01)
*G11C 7/02* (2006.01)

(52) U.S. Cl.
CPC .............. *G05F 1/613* (2013.01); *G11C 5/14* (2013.01); *G11C 7/02* (2013.01)

(58) Field of Classification Search
USPC .......................................................... 361/56
See application file for complete search history.

(56) References Cited

U.S. PATENT DOCUMENTS

| 4,833,344 | A | * | 5/1989 | Moon ....................... G05F 3/30 323/312 |
| 6,838,907 | B1 | * | 1/2005 | Artsi .................... H04L 25/0278 326/30 |
| 7,456,655 | B1 | * | 11/2008 | Ben Artsi ............... H01L 24/49 326/82 |

(Continued)

FOREIGN PATENT DOCUMENTS

KR   10-2013-0072089    7/2013

OTHER PUBLICATIONS

Final Rejection dated Oct. 25, 2016 in related /corresponding Korean Patent Appl. No. 10-2014-0187479, filed Dec. 23, 2014.

(Continued)

*Primary Examiner* — Ronald W Leja

(57) ABSTRACT

A power supply noise reduction circuit and a power supply noise reduction method are provided. An integrated circuit includes an input node configured to receive a signal via a transmission line. The integrated circuit also includes termination circuitry configured to electrically couple the input node to a power rail of the integrated circuit. The integrated circuit further includes a circuit component coupled to the power rail. The circuit component is configured to bleed off a portion of current on the power rail based on a determination that a voltage on the power rail meets or exceeds a high voltage threshold. The circuit component is also configured to bleed off a smaller portion of the current on the power rail based on a determination that the voltage on the power rail is less than the high voltage threshold.

19 Claims, 7 Drawing Sheets

(56) References Cited

U.S. PATENT DOCUMENTS

| | | | |
|---|---|---|---|
| 2004/0160712 A1* | 8/2004 | Zack | H02H 9/046 361/56 |
| 2005/0104734 A1* | 5/2005 | Graube | G01R 31/025 340/650 |
| 2008/0062595 A1* | 3/2008 | Ping | H01L 27/0266 361/56 |
| 2010/0237904 A1* | 9/2010 | Shau | H03K 19/01858 326/30 |
| 2013/0022134 A1* | 1/2013 | Ben Artsi | H04L 25/03878 375/257 |
| 2013/0221117 A1* | 8/2013 | Warren | G05D 23/19 236/1 C |
| 2013/0308231 A1 | 11/2013 | Shan et al. | |
| 2015/0177773 A1* | 6/2015 | Ben Artsi | G05F 1/613 323/299 |

OTHER PUBLICATIONS

Office Action dated Mar. 16, 2016 in related/corresponding Korean Patent Appl. No. 10-2014-0187479 filed Dec. 23, 2014.
Office Action dated Mar. 22, 2016 in related/corresponding Taiwanese Patent Appl. No. 103145056 filed Dec. 23, 2014.

\* cited by examiner

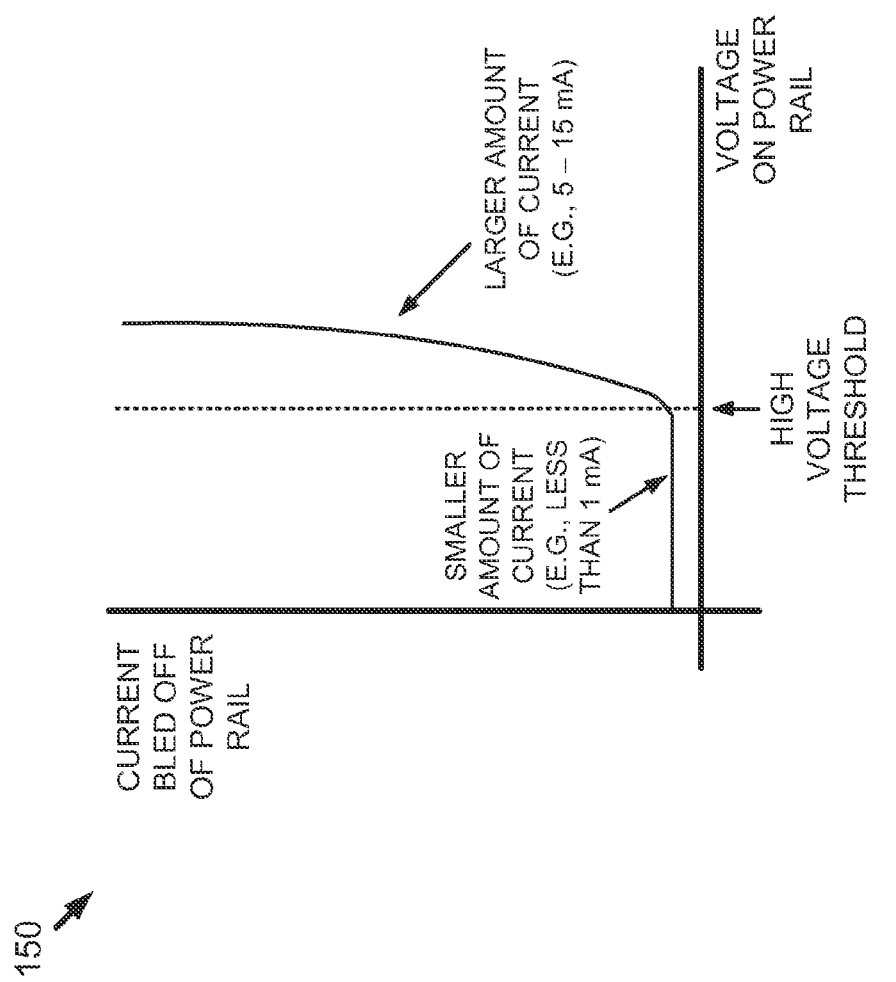

POWER SUPPLY NOISE REDUCTION CIRCUIT AND POWER SUPPLY NOISE REDUCTION METHOD

CROSS-REFERENCE TO RELATED APPLICATIONS

This application claims priority to U.S. Provisional Patent Application No. 61/920,166, filed Dec. 23, 2013, entitled "Power Noise Clipping Scheme for DDR Interfaces," which is incorporated herein by reference in its entirety.

FIELD

The technology described herein relates generally to the field of communications and more particularly to electronic signaling between integrated circuit devices.

BACKGROUND

High-speed data communication integrated circuit (IC) dies include both drivers and receivers. The driver of one such IC connects to the receiver of another IC via a signal transmission line. The signal transmission line includes, in an example embodiment, a trace of a printed circuit (PC) board that electrically couples the driver to the receiver. Such driver and receiver circuits may be used, for example, in Double Data Rate (DDR) interfaces, which may include a POD (pseudo open drain) termination scheme. DDR interfaces are configured to transmit and receive data on both rising and falling edges of a timing signal.

The description above is presented as a general overview of related art in this field and should not be construed as an admission that any of the information it contains constitutes prior art against the present patent application.

SUMMARY

Examples of a power supply noise reduction circuit and a power supply noise reduction method are provided. An example integrated circuit includes an input node configured to receive a signal via a transmission line. The integrated circuit also includes termination circuitry configured to electrically couple the input node to a power rail of the integrated circuit. The integrated circuit further includes a circuit component coupled to the power rail. The circuit component is configured to bleed off a portion of current on the power rail based on a determination that a voltage on the power rail meets or exceeds a high voltage threshold. The circuit component is also configured to bleed off a smaller portion of the current on the power rail based on a determination that the voltage on the power rail is less than the high voltage threshold.

As another example, an integrated circuit includes a core voltage rail configured to provide an operating voltage to a sub-circuit of the integrated circuit. The integrated circuit also includes a circuit component coupled between the core voltage rail and a ground rail. The circuit component is configured to bleed off a portion of current on the core voltage rail based on a determination that a voltage on the core voltage rail meets or exceeds a high voltage threshold. The circuit component is also configured to bleed off a smaller portion of the current on the core voltage rail based on a determination that the voltage on the core voltage rail is less than the high voltage threshold.

As another example, a method includes receiving a signal at an input node of an integrated circuit, the integrated circuit including termination circuitry configured to electrically couple the input node to a power rail of the integrated circuit. The method also includes determining that a voltage on the power rail meets or exceeds a high voltage threshold. In response to the determining that the voltage meets or exceeds the high voltage threshold, a portion of current on the power rail is bled off at a circuit component. The method further includes determining that the voltage on the power rail is less than the high voltage threshold. In response to the determining that the voltage is less than the high voltage threshold, a smaller portion of the current on the power rail is bled off at the circuit component.

As a further example, a system includes a transmission-side integrated circuit including a driver circuit component configured to generate a signal. The system also includes a receiver-side integrated circuit having an input node configured to receive the signal via a transmission line, where the transmission line couples the driver circuit component to the input node. The receiver-side integrated circuit also includes termination circuitry configured to electrically couple the input node to a power ail of the receiver-side integrated circuit. The receiver-side integrated circuit further includes an electrical circuit component coupled to the power rail and being configured to (i) bleed off a portion of current on the power rail based on a determination that a voltage on the power rail meets or exceeds a high voltage threshold, and (ii) bleed off a smaller portion of the current on the power ail based on a determination that the voltage on the power rail is less than the high voltage threshold.

BRIEF DESCRIPTION OF THE DRAWINGS

FIG. 1B is a graph showing an amount of current bled off of a power rail as a function of voltage on the power rail in accordance with an embodiment of the disclosure.

DETAILED DESCRIPTION

Figure 1A:
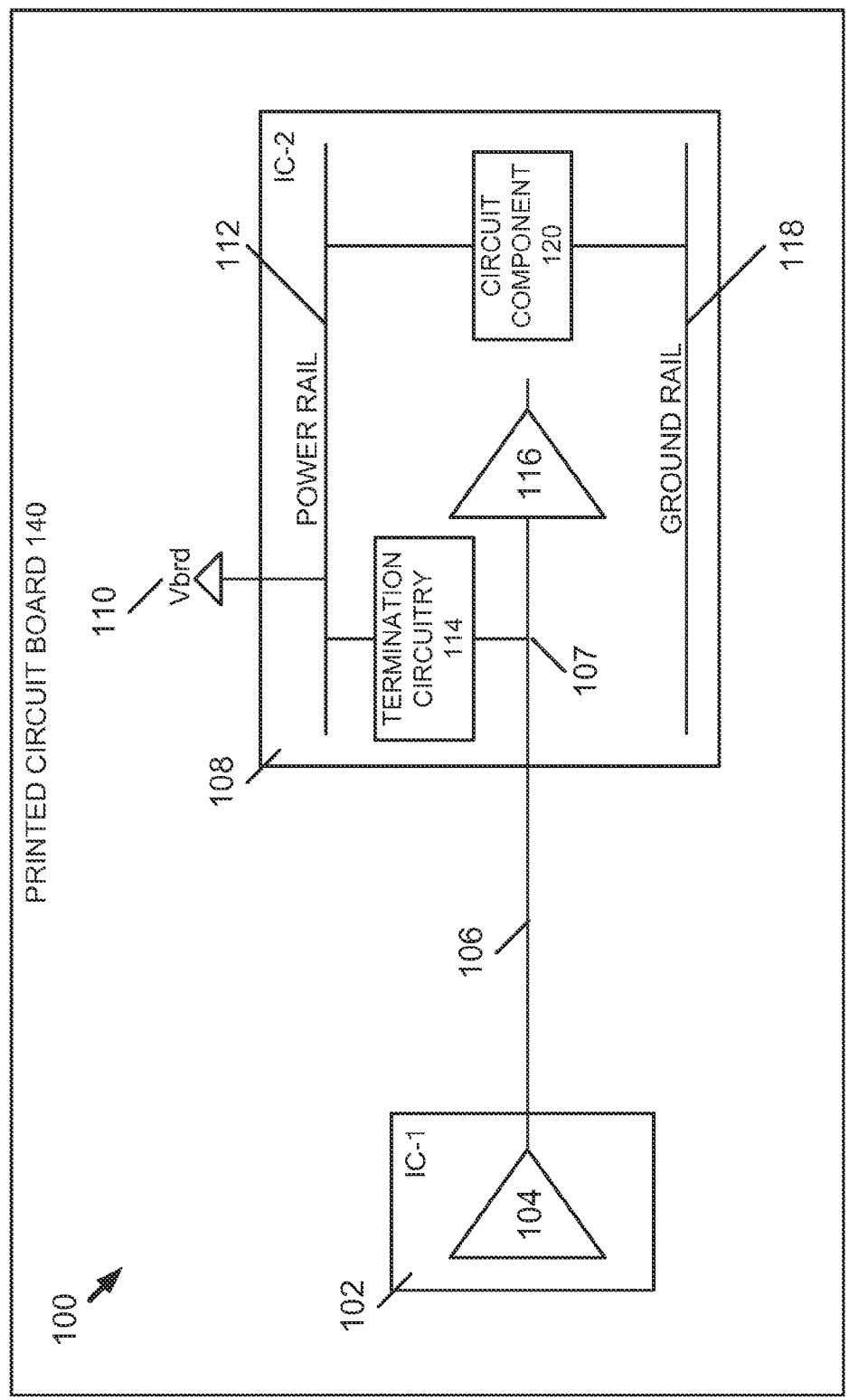
FIG. 1A is a block diagram depicting a communication system in accordance with embodiment of the disclosure.

FIG. 1A is a block diagram depicting a communication system 100 in accordance with an embodiment of the disclosure. In the system 100, a first integrated circuit (IC) die 102 includes a driver 104 for transmitting a signal to a second IC die 108 via a transmission line 106. The second IC die 108 receives the signal at an input node 107. An input terminal of a receiver 116 is coupled to the input node 107, thus enabling the receiver 116 to receive the transmitted signal. The communication system 100 uses parallel termination for the transmission line 106, in an embodiment.

Thus, as shown in FIG. 1A, the transmission line 106 is coupled to a power rail 112 of the second IC die 108 via termination circuitry 114. In an embodiment of the disclosure, the transmission line 106 includes a printed circuit board (PCB) trace that electrically couples the first and second IC dies 102, 108. The power rail 112 is an internal power rail of the second IC die 108 and is not part of a PCB 140 to which the die 108 is coupled. The components of the system 100, including the first and second IC dies 102, 108, are mounted on the PCB 140.

In the embodiment of the disclosure illustrated in FIG. 1A, the termination circuitry 114 is included on the second IC die 108 and couples the input node 107 of the die 108 to the power rail 112 of the die 108. Such a termination scheme may be referred to as a POD (pseudo open drain) termination scheme. The termination circuitry 114 included on the die 108 is known as "on-die termination" (ODT) circuitry. In other embodiments of the disclosure, the termination circuitry 114 is located off-die. The termination circuitry 114 provides impedance matching between the transmission line 106 and the receiver 116, in an embodiment. Specifically, the termination circuitry 114 has an impedance value that causes an input impedance at the receiver 116 to be set to a specific impedance value aimed to prevent or decrease signal reflections at the receiver 116. Such signal reflections cause distortions to the signal transmitted by the driver 104 and negatively affect the quality and reliability of the signal transmission from the driver 104 to the receiver 116.

The power rail 112 of the IC die 108 is configured to provide an operating voltage to various components of the die 108. In the embodiment of the disclosure illustrated in FIG. 1A, the power rail 112 is coupled to a power supply voltage $V_{brd}$ 110 of the off-die PCB 140. The PCB 140 thus provides a power supply to the second IC die 108 via the power supply voltage $V_{brd}$ 110. Under certain conditions, noise can form on the power rail 112. For example, toggling of the signal transmitted by the driver 104 can result in a current profile on the transmission line 106 that causes noise on the power rail 112. This noise causes a voltage on the power rail 112 to vary from its nominal value. In an embodiment of the disclosure, the power supply voltage $V_{brd}$ 110 from the off-die PCB 140 is equal to a particular direct current (DC) voltage, and the noise at the power rail 112 causes the voltage at the power rail 112 to vary from the nominal DC voltage with a certain amount of noise.

In an embodiment of the disclosure illustrated in FIG. 1A, the noise on the power rail 112 causes the voltage on the power rail 112 to be in an undesirable high voltage state, with the voltage exceeding the nominal voltage that should be present on the power rail 112. The voltage on the power rail 112 may be determined to be in the high voltage state based on, for example, the voltage on the power rail 112 meeting or exceeding a high voltage threshold. In an embodiment, the noise on the power rail 112 has a resonance characteristic and may be termed "resonance noise." Such resonance noise causes the voltage on the power rail 112 to oscillate between maximum and minimum voltages at a specific frequency or multiple different frequencies. The oscillating voltages on the power rail 112 include voltages that meet or exceed the high voltage threshold.

The noise on the power rail 112 can be coupled to the signal at the input node 107 via the termination circuitry 114, and the coupled noise distorts the signal and causes undesirable resonance in the signal. To suppress this coupling of noise from the power rail 112 to the signal, the second IC die 108 includes a circuit component 120. As shown in FIG. 1A, the circuit component 120 includes a first terminal that is directly connected to the power rail 112 and a second terminal that is directly connected to a ground rail of the die 108. In an embodiment of the disclosure, the circuit component 120 is a passive electrical circuit component and may thus comprise a resistor, a diode, a capacitor, another passive electrical circuit component, or various combinations of such passive electrical circuit components. In another embodiment of the disclosure, the circuit component 120 is an active electrical circuit and may thus comprise one or more transistors, another active electrical circuit component, or various combinations of such active electrical circuit components. In another embodiment of the disclosure, the circuit component 120 comprises one or more passive electrical circuit components and one or more active electrical circuit components. In an embodiment, the passive and/or active electrical circuit components may be integrated into the IC die 108, for example, as part of a photolithographic or similar circuit manufacture.

As explained above, during periods of time in which noise is present on the power rail 112, the voltage on the power rail 112 may be in the high voltage state, with the voltage on the power rail 112 meeting or exceeding the high voltage threshold. During these periods of time, the circuit component 120 lowers the voltage on the power rail 112 by bleeding off a portion of current on the power rail 112. The voltage is lowered to a value that is below the high voltage threshold, thus removing the voltage on the power rail 112 from the high voltage state. Because the noise on the power rail 112 is evidenced by the voltage on the power rail 112 being greater than or equal to the high voltage threshold, this lowering of the voltage effectively reduces the noise on the power rail 112. By reducing the noise on the power rail 112, the coupling of noise from the power rail 112 to the signal via the termination circuitry 114 is suppressed. It is noted that the circuit component 120 purposefully causes a leakage of current from the power rail 112 in order to reduce the voltage on the power rail 112 and to suppress the coupling of noise from the power rail 112 to the signal at the input node 107.

During periods of time when the voltage on the power rail 112 is below the high voltage threshold, noise is not present on the power rail 112. During these periods of time, the voltage on the power rail 112 is closer to or equal to its nominal value, where the nominal value is equal to the DC voltage supplied by the power supply voltage $V_{brd}$ 110 from the off-die PCB 140. In such situations, the circuit component 120 is configured to bleed off a smaller portion of the current on the power rail 112. The voltage on the power rail 112 is not significantly affected by the bleeding off of the smaller portion of the current, and the voltage on the power rail 112 may be lowered by only a small, insignificant amount. Thus, the circuit component 120 does not operate continuously to regulate the voltage on the power rail 112 but rather only operates to significantly lower the voltage in situations where the voltage bias met or exceeded the high voltage threshold. The circuit 120 does not include a conventional voltage regulator configured to regulate the voltage on the power rail 112. Such conventional voltage regulators are designed to maintain a constant voltage level at a circuit component at all times, and as explained above, the circuit component 120 does not operate continuously to regulate the voltage on the power rail 112.

It is noted that the amount of current bled off of the power rail 112 does not change linearly in response to changes in the voltage on the power rail 112, in an embodiment. Specifically, the smaller amount of current bled off when the voltage is below the high voltage threshold is relatively small (e.g., in the range of microamperes and generally less than 1 mA). The larger amount of current bled off when the voltage on the power rail 112 is above the high voltage threshold is significantly greater than the smaller amount of current and may be in the range of 5 mA-15 mA, for example. Thus, when the voltage on the power rail 112 is below the high voltage threshold, the current bled off of the power rail 112 is relatively small, and a significant increase in the amount of current bled off occurs when the voltage meets or exceeds the high voltage threshold. This is shown in the example graph 150 of FIG. 1B, which depicts the amount of current bled off of the power rail 112 as a function of the voltage on the power rail 112 in accordance with an embodiment of the disclosure. As noted above, in an embodiment, the voltage on the power rail 112 is lowered by only a small, insignificant amount when the smaller amount of current is bled off of the power rail 112, but the voltage on the power rail 112 is lowered significantly when the larger amount of current is bled off of the power rail 112. Thus, it is noted that the reductions in the voltage on the power rail 112 are nonlinear, and a significant increase in the voltage reduction occurs when the voltage on the power rail 112 meets or exceeds the high voltage threshold, in an embodiment.

It is noted that the circuit component 120 does not remove or otherwise filter noise that has been coupled to the signal at the input node 107. Rather, as described above, the circuit component 120 decreases the noise on the power rail 112 by towering the voltage on the power rail 112 when the voltage is determined to meet or exceed the high voltage threshold. By bleeding off current when the voltage on the power rail is at the high voltage state, the circuit effectively acts to decay resonant noise on the power rail.

In an embodiment of the disclosure, the system 100 is used in implementing a double data rate (DDR) data transfer. In this embodiment, the IC dies 102, 108 comprise portions of DDR interfaces (e.g., DDR4 interfaces). For example, the driver 104 is a DQS driver configured to drive a DQS clock signal to the second IC die 108 via the transmission line 106, in an embodiment. The driver 104 can also be a data driver configured to drive a data signal to the second IC die 108. Further, in this embodiment, the receiver 116 is a DQS receiver configured to receive the DQS clock signal or a data receiver configured to receive the data signal. It is noted that the system 100 is not limited to DDR data transfers.

Figure 2:
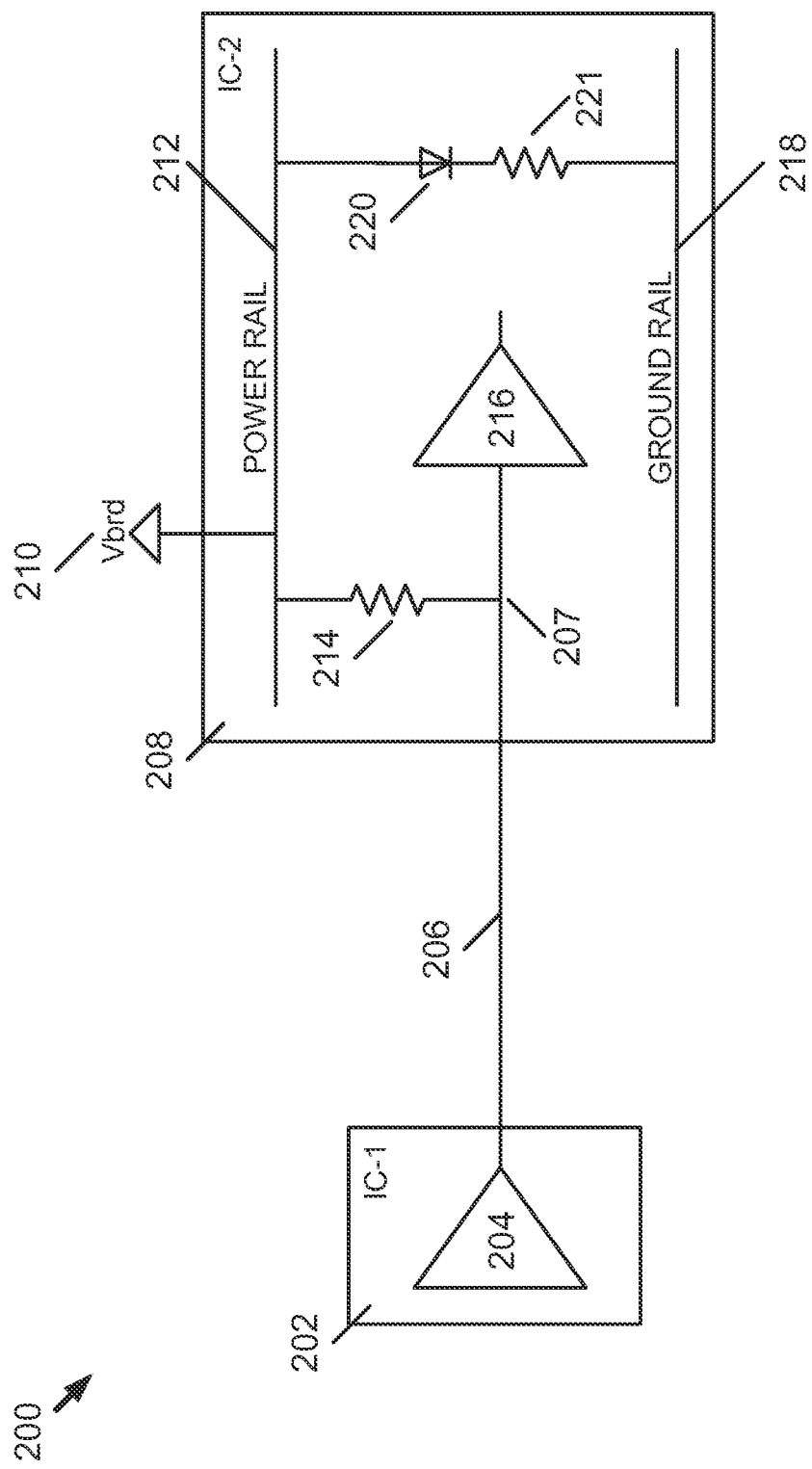
FIG. 2 is a block diagram depicting a receiver-side IC die including a diode and a resistor coupled in series to a power rail in accordance with an embodiment of the disclosure.

FIG. 2 is a block diagram depicting a receiver-side IC die 208 including a diode 220 and a resistor 221 coupled in series to a power rail 212 in accordance with an embodiment of the disclosure. In the communication system 200 depicted in FIG. 2, a transmitter-side IC die 202 includes a driver 204 for driving a signal to the receiver-side IC die 208 via a transmission line 206. The receiver-side IC die 208 receives the signal at an input node 207 that is coupled to an input terminal of a receiver 216. A resistor 214 is coupled between the input node 207 and the power rail 212 of the receiver-side IC die 208. The resistor 214 is used to terminate the received signal and has an impedance value that causes an input impedance of the receiver 216 to match a characteristic impedance of the transmission line 206.

The power rail 212 of the receiver-side IC die 208 receives a voltage from a power supply voltage $V_{brd}$ 210 of an off-die PCB. To suppress noise on power rail 212 and thus suppress a coupling of noise from the power rail 212 to the signal via the resistor 214, the receiver-side IC die 208 includes the diode 220 and the resistor 221 coupled in series to the power rail 212. In the embodiment of the disclosure illustrated in FIG. 2, the diode 220 and the resistor 221 are coupled between the power rail 212 and a ground rail 218 of the receiver-side IC die 208.

The diode 220 and the resistor 221 are configured to bleed off a portion of current on the power rail 212 when a voltage on the power rail 212 meets or exceeds a high voltage threshold. As described in further detail below, in an embodiment, the high voltage threshold is imposed by the diode 220. For example, in an embodiment, the high voltage threshold is based on a knee voltage (i.e., a cut-in voltage) of the diode 220 and/or one or more other parameters of the diode 220. The bleeding off of the current on the power rail 212 lowers the voltage on the power rail 212 to an unregulated voltage that is below the high voltage threshold imposed by the diode 220. The voltage on the power rail 212 is said to be lowered to an "unregulated voltage" to evidence the absence of a conventional voltage regulator in the chip 208 and to indicate that the lowered voltage may vary based on various factors (e.g., a temperature of the system 200, the power supply voltage $V_{brd}$ 210 received from the off-die PC board, etc.). Because the high voltage state on the power rail 212 is a result of noise on the power rail 212, the lowering of the voltage lowers the noise on the power rail 212 and thus reduces an amount of noise coupled from the power rail 212 to the signal. The diode 220 and the resistor 221 are further configured to bleed off a smaller portion of the current on the power rail 212 when the voltage on the power rail 212 is less than the high voltage threshold. When the smaller portion of the current is bled off, the voltage on the power rail 212 is not significantly affected. It is noted that the amount of current bled off of the power rail 212 is non-linear, with a significant jump occurring when the voltage on the power rail 212 meets or exceeds the high voltage threshold.

In an embodiment of the disclosure, the diode 220 and the resistor 221 are configured to bleed off an unregulated quantity of current on the power rail 212 that is significantly greater when the voltage on the power rail 212 meets or exceeds the high voltage threshold as compared to when the voltage on the power rail 212 is below the high voltage threshold. The current bled off of the power rail 212 is said to be an "unregulated quantity of current" to evidence the absence of a conventional current regulator in the chip 208 and to indicate that the quantity of current bled off may vary based on various factors (e.g., a temperature of the system 200, the power supply voltage $V_{brd}$ 210 received from the off-die PCB, etc.).

The diode 220 enables the bleeding off of the differing quantities of current based on the voltage on the power rail 212 in comparison to the high voltage threshold. In an embodiment of the disclosure, when the voltage on the power rail 212 is below the high voltage threshold, a voltage across the diode 220 is below a knee voltage (i.e., a cut-in voltage) of the diode 220, and the diode 220 is able to conduct only a relatively small amount of current. The knee voltage of the diode 220 defines a forward voltage across the diode 220 at which the diode 220 starts to conduct significantly and may be equal to a barrier potential of a p-n junction included in the diode 220. In these situations, the relatively small amount of current is bled off from the power rail 212, and the voltage on the power rail 212 is not significantly affected by this bleeding of current. The relatively small amount of current may be in the range of microamperes and may generally be less than 1 mA, for example. By contrast, when the voltage on the power rail 212 is above the high voltage threshold, the voltage across the diode 220 is above the knee voltage, and the diode 220 is able to conduct a significantly higher amount of current. The higher amount of current may be in the range 5 mA-15 mA, for example. In these situations, the higher amount of current is bled off of the power rail 212, and the voltage on the power rail 212 is lowered due to this bleeding of current. In an embodiment, the high voltage threshold is based on the knee voltage of the diode 220. In this embodiment, the high voltage threshold is a voltage on the power rail 212 that causes a forward voltage across the diode 220 to meet or exceed the knee voltage of the diode 220. In other embodiments, the high voltage threshold is based on one or more other parameters of the diode 220 (e.g., a size of the diode 220, materials of the diode 220, etc.).

In an embodiment of the disclosure, a size and/or other parameters of the diode 220 are optimized to allow the conducting of the higher amount of current only at voltages on the power rail 212 that meet or exceed the high voltage threshold. It is noted that the voltage-lowering function of the diode 220 and the resistor 221 is enabled only in situations where the voltage on the power rail 212 is above the high voltage threshold. Thus, these components 220, 221 do not operate continuously to regulate the voltage on the power rail 212 but rather only operate to lower the voltage in situations where the voltage has met or exceeded the high voltage threshold. Lowering the voltage on the power rail 212 when the voltage is at or above the high voltage threshold helps suppress voltage noise and voltage resonance on the power rail 212.

The resistor 221 limits an amount of current that is bled off of the power rail 212 through the diode 220 and the resistor 221. As described above, the diode 220 and the resistor 221 purposefully cause a leakage of current from the power rail 212 in order to suppress the coupling of noise from the power rail 212 to the signal at the input node 207. In an embodiment of the disclosure, a resistance value of the resistor 221 is selected in order to adequately suppress the coupling of noise to the signal while also keeping the leakage of current at an acceptable value. In examples where the power rail 212 has a nominal voltage within a range of 1.2 V to 5.0 V, the resistance value of the resistor 221 is within a range of 30 ohms to 50 ohms, for example. It is noted that these resistance values are merely examples and that in other examples, a higher or lower resistance value is used.

The use of the diode 220 and the resistor 221 coupled in series to the power rail 212 is merely an example. In another embodiment of the disclosure, the diode 220 is not used, and instead, only a resistor is coupled between the power rail 212 and the ground rail 218. In yet another embodiment of the disclosure, the resistor 221 is not used, and instead, only a diode is coupled between the power rail 212 and the ground rail 218. Other components are used in place of the diode 220 and/or the resistor 221 in other examples. The other components may comprise one or more passive electrical circuit components and/or one or more active electrical circuit components, as described above.

Figure 3:
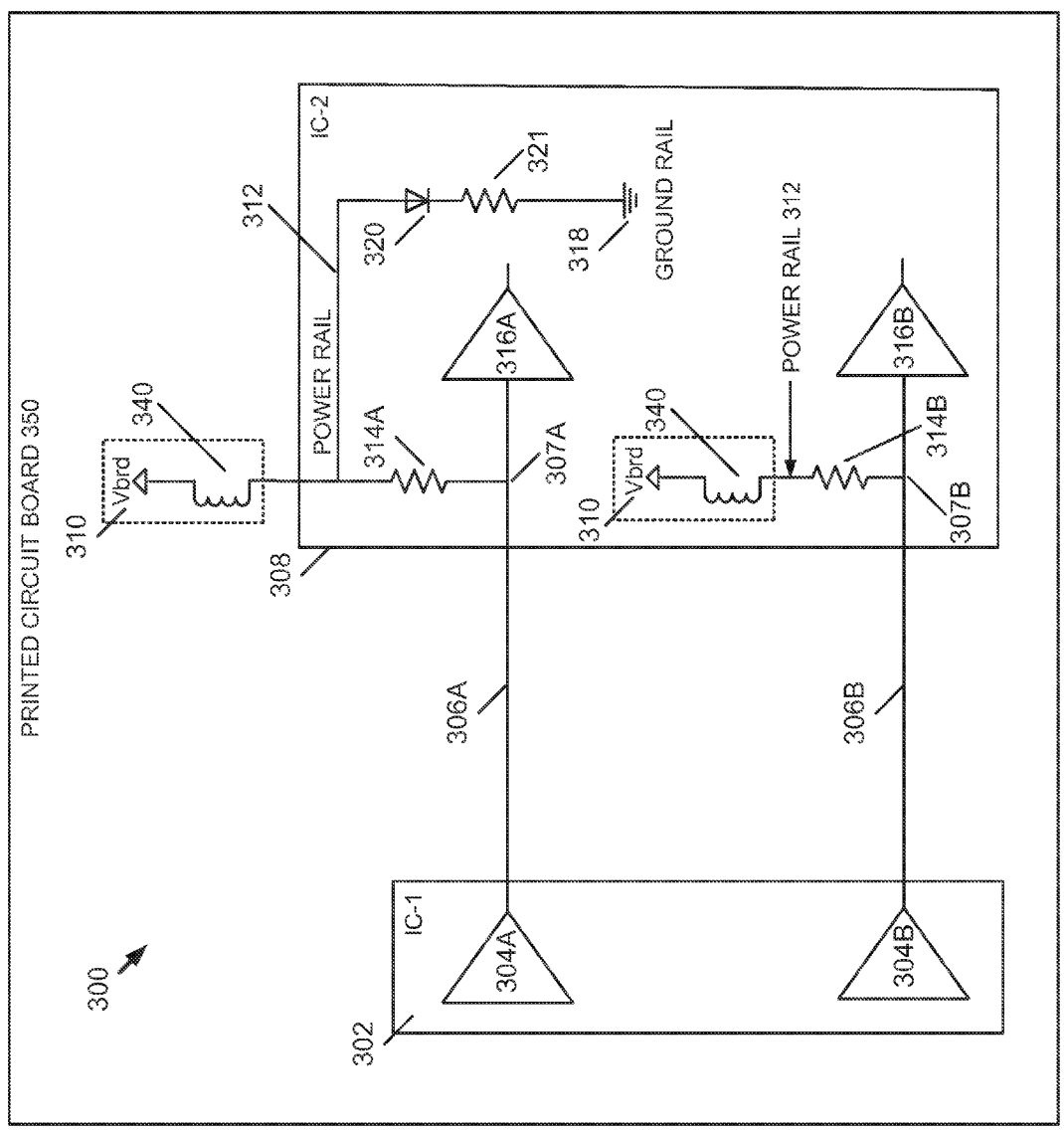
FIG. 3 is a block diagram depicting a communication system, where a transmitter-side IC die includes a plurality of drivers and a receiver-side IC die includes a plurality of receivers in accordance with an embodiment of the disclosure.

FIG. 3 is a block diagram depicting a communication system 300, where a transmitter-side IC die 302 includes a plurality of drivers 304A, 304B and a receiver-side IC die 308 includes a plurality of receivers 316A, 316B in accordance with an embodiment of the disclosure. In the communication system 300, the transmitter-side IC die 302 includes the driver 304A for transmitting a first signal to the receiver-side IC die 308 via a first transmission line 306A. The transmitter-side IC die 302 further includes the driver 304B for transmitting a second signal to the receiver-side IC die 308 via a second transmission line 306B. The receiver-side IC die 308 receives the first signal at a first input node 307A and the second signal at a second input node 307B. The input nodes 307A, 307B are coupled to input terminals of receivers 316A, 316B, respectively. A resistor 314A is coupled between the input node 307A and a power rail 312 of the receiver-side IC die 308, and a resistor 314B is coupled between the input node 307B and the power rail 312. The resistors 314A, 314B are used to terminate the signals received from the drivers 304A, 304B, respectively.

The power rail 312 of the receiver-side IC die 308 receives a voltage from a power supply voltage $V_{brd}$ 310 of an off-die PCB 350. In an embodiment, the components of the system 300, including the IC dies 302, 308, are mounted on the PCB 350. In an embodiment of the disclosure, the connection between the power rail 312 and the power supply voltage $V_{brd}$ 310 has a parasitic inductance, and thus, FIG. 3 depicts an inductor 340 coupled in series between the power rail 312 and the power supply voltage $V_{brd}$ 310. The power supply voltage $V_{brd}$ 310 and the inductor 340 are included in dashed-line boxes to indicate that these components 310, 340 are not included on the die 308, in an embodiment. The parasitic inductance is caused by vias of the PCB 350 and/or components of a package used in coupling the die 308 to the PCB 350.

As described above, noise can form on the power rail 312 under certain conditions. As described above, the noise formed on the power rail 312 may be resonance noise. For example, resonance noise can form on the power rail 312 as a result of toggling of one or more of the signals transmitted by the drivers 304A, 304B. An amount of noise caused by the signal toggling is increased when the signals transmitted by the drivers 304A, 304B toggle simultaneously. The noise caused by simultaneous toggling of the signals is known as "simultaneous switching noise" (SSN) that is due to the simultaneous switching outputs (SSO) of the drivers 304A, 304B. In an embodiment, the amount of noise on the power rail 312 as a result of the toggling signal or signals is based on an amount of the parasitic inductance at the connection between the power rail 312 and the power supply voltage 310 and an amount of internal capacitance of the die 308. For example, a higher parasitic inductance at the connection between the power rail 312 and the power supply voltage 310 may result in a higher amount of noise on the power rail 312. Similarly, a smaller internal capacitance of the die 308 may result in a higher amount of noise on the power rail 312. It is noted that noise on the power rail 312 can also be a result of one or more of the receivers 316A, 316B switching states, in an embodiment. When a signal on a line coupled to a receiver switches to a high state, voltage noise on the line caused by the switching may be coupled from the line to the power rail 312 via termination circuitry (resistors 314A, 314B of FIG. 3) in accordance with Lenz's law, in an embodiment.

In an embodiment of the disclosure, to prevent noise from being coupled from the power rail 312 to the signals via the resistors 314A, 314B, the receiver-side IC die 308 includes a diode 320 and a resistor 321 coupled between the power rail 312 and a ground rail 318. The diode 320 and the resistor 321 are configured to bleed off a portion of current on the power rail 312 based on the voltage on the power rail 312 meeting or exceeding a high voltage threshold. In an embodiment, the high voltage threshold is imposed by the diode 320 and may be based, for example, on a knee voltage of the diode 320 and/or one or more other parameters of the diode 320, as described above. The bleeding off of this portion of the current clips the voltage on the power rail 312, thus preventing the voltage from exceeding some voltage level. The clipping of the voltage on the power rail 312 lowers the voltage below the high voltage threshold, thus removing the voltage from the high voltage state as well as suppressing resonance noise. The diode 320 and the resistor 321 are also configured to bleed off a smaller portion of the current on the power rail 312 when the voltage on the power rail 312 is less than the high voltage threshold. The bleeding off of the smaller portion of the current does not significantly affect the voltage on the power rail 312.

In an embodiment of the disclosure, the amount of current that is bled off by the diode 320 and the resistor 321 is optimized based on the drivers 304A, 304B of the transmitter-side IC die 302. For example, if it is anticipated that the drivers 304A, 304B will cause the transmitted signals to toggle simultaneously and that this condition will result in a high noise level on the power rail 312 on the receiving side, parameters of the diode 320 and/or the resistor 321 are designed accordingly. In this example, the high noise level may result in a voltage on the power rail 312 that is significantly higher than the high voltage threshold. Consequently, to lower the voltage below the high voltage threshold, as well as suppress possible resonance noise, a relatively large amount of current is bled off from the power rail 312, and a resistance value of the resistor 321 is designed based on this objective (e.g., a relatively small resistance value is selected to bleed off the relatively large amount of current). Alternatively, if it is anticipated that the drivers 304A, 304B will not cause the transmitted signals to toggle simultaneously, or the voltage on the power rail 312 will not go above the high voltage threshold value, the resistance value of the resistor 321 is designed to bleed of a smaller amount of current from the power rail 312.

The embodiment of the disclosure illustrated in FIG. 3 depicts the transmitter-side IC die 302 having two drivers 304A, 304B and the receiver-side IC die 308 having two receivers 316A, 316B. Further, in FIG. 3, the diode 320 and the resistor 321 collectively comprise a single clipping circuit component for suppressing the coupling of noise from the power rail 312 to the signals received via the transmission lines 306A, 306B. However, in other embodiments of the disclosure, the die 302 includes more than two drivers, and the die 308 includes more than two receivers. In such instances, more than one clipping circuit component may be used to suppress the coupling of noise from the power rail 312 to the signals. For example, in an example where the transmitter-side die 302 includes sixteen drivers and the receiver-side die 308 includes sixteen receivers, two clipping circuit components are coupled between the power rail 312 and the ground rail 318. These two clipping circuit components are connected to each other in parallel to achieve the desired clipping, in an embodiment. In designing the clipping circuit or circuits to be included on the receiver-side IC die 308, the number of drivers included on the transmission-side IC die 302 and/or the amount of noise caused by these drivers may be taken into account. The number of clipping circuits and the parameters of the clipping circuits included on the die 308 may be optimized based on these factors.

Figure 4:
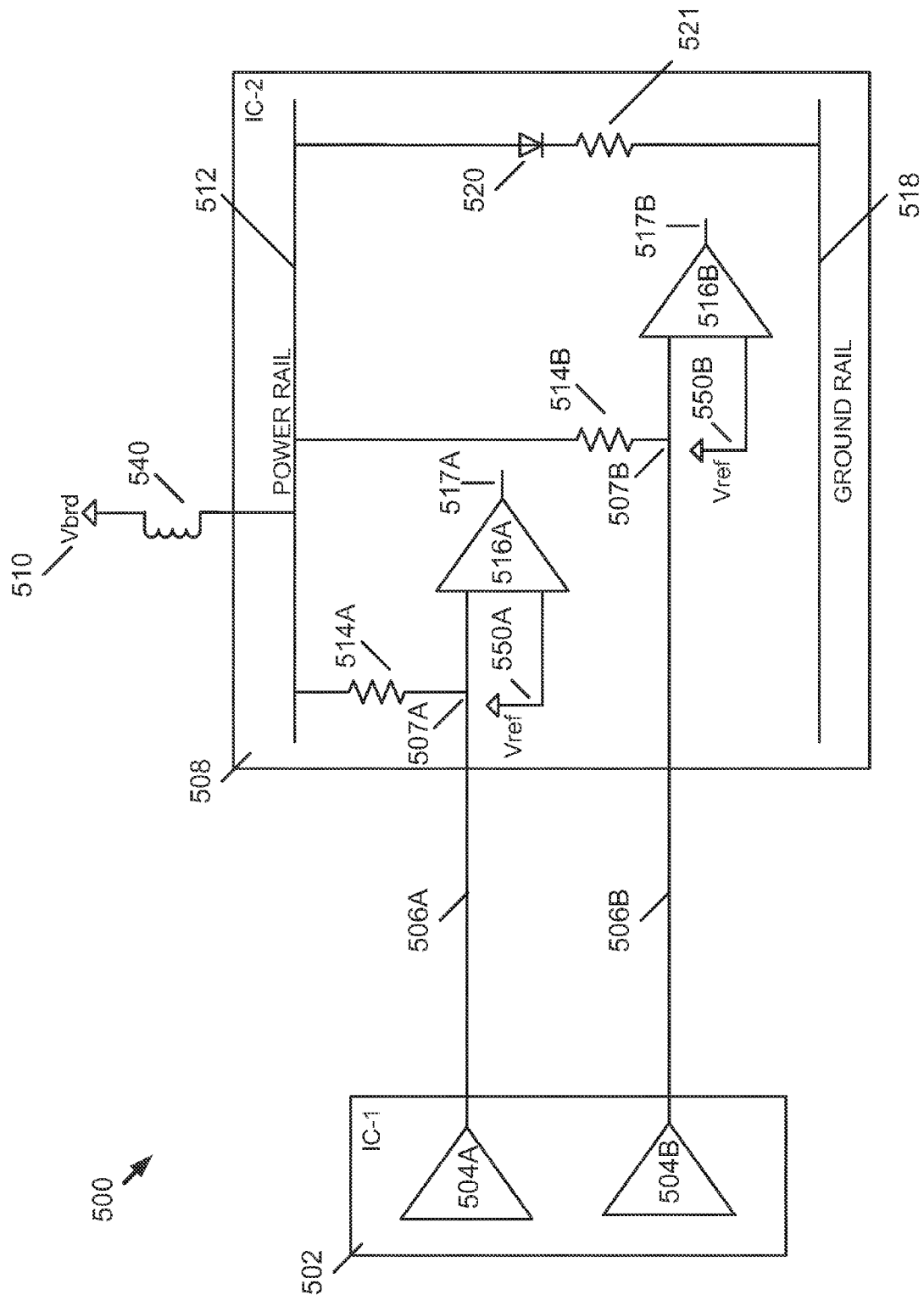
FIG. 4 is a block diagram depicting a receiver-side IC die including plural receivers connected to the same power rail in accordance with an embodiment of the disclosure.

FIG. 4 is a block diagram depicting a receiver-side IC die 508 including plural receivers 516A, 516B configured to generate outputs 517A, 517B, respectively. In an embodiment, each of the receivers 516A, 516B is implemented as a differential receiver. In a communication system 500, a transmitter-side IC die 502 includes a driver 504A for transmitting a first signal to the receiver-side IC die 508 via a first transmission line 506A. The transmitter-side IC die 502 further includes a driver 504B for transmitting a second signal to the receiver-side IC die 508 via a second transmission line 506B. The receiver-side IC die 508 receives the first signal at a first input node 507A and the second signal at a second input node 507B. The input nodes 507A, 507B are coupled to input terminals of the receivers 516A, 516B, respectively. A resistor 514A is coupled between the input node 507A and a power rail 512 of the receiver-side IC die 508, and a resistor 514B is coupled between the input node 507B and the power rail 512. The power rail 512 of the receiver-side IC die 508 receives a voltage from a power supply voltage $V_{brd}$ 510 of an off-die PCB. A parasitic inductance on the connection between the power rail 512 and the power supply voltage $V_{brd}$ 510 is represented in FIG. 4 by an inductor 540.

To suppress the coupling of noise from the power rail 512 to the first and second signals via the resistors 514A, 514B, the die 508 includes a diode 520 and a resistor 521 coupled between the power rail 512 and a ground rail 518 of the die 508. The use of the diode 520 and resistor 521 in suppressing the coupling of noise from the power rail 512 to the first and second signals is described above with reference to FIGS. 2 and 3.

Despite the use of the diode 520 and the resistor 521, some amount of noise may nevertheless be coupled from the power rail 512 to the first and second signals. In an embodiment of the disclosure, to remove at least a portion of the noise coupled to the signals, the receiver-side IC die 508 utilizes a reference voltage generation scheme. Specifically, each of the receivers 516A, 516B included on the die 508 includes (i) a first input that is coupled to an input node of the die 508, and (ii) a second input that is configured to receive a reference voltage. Thus, as shown in FIG. 4, the receiver 516A has a first input coupled to the input node 507A and a second input that is configured to receive a reference voltage 550A. Similarly, the receiver 516B has a first input coupled to the input node 507B and a second input that is configured to receive a reference voltage 550B.

In an embodiment where the receivers 516A, 516B are implemented as differential receivers, the output 517A generated by the receiver 516A is based on a difference between the signal received via the first input of the receiver 516A and the reference voltage 550A received via, the second input. Similarly, in this embodiment, the output 517B generated by the receiver 516B is based on a difference between the signal received via the first input of the receiver 516B and the reference voltage 550B received via the second input. The reference voltage 550A is said to "track" the noise coupled to the first signal via the resistor 514A, and the reference voltage 550B is said to "track" the noise coupled to the second signal via the resistor 514B. Specifically, the noise coupled to the first and second signals may cause (i) a voltage of the first signal to exceed its respective nominal value by an amount $\Delta V_1$, and (ii) a voltage of the second signal to exceed its respective nominal value by an amount $\Delta V_2$, and the reference voltages 550A, 550B may likewise increase by the amounts $\Delta V_1$ and $\Delta V_2$, respectively. Thus, for example, if noise coupled to the first signal causes the voltage of the first signal to exceed its nominal value by 0.15 V during a period of time, the reference voltage 550A may also increase by 0.15 V during this period of time. In an embodiment, the reference voltages 550A, 550B increase by the amounts $\Delta V_1$ and $\Delta V_2$, respectively, because the voltage increases $\Delta V_1$ and $\Delta V_2$ are a result of noise on the power rail 512, and noise on the power rail 512 is coupled in a same manner between the power rail 512 and the first and second input nodes 507A, 507B as it is between the power rail 512 and the reference voltages 550A, 550B.

When the subtraction operation is performed by the receivers 516A, 516B, at least a portion of the noise coupled to the first and second signals is removed in the outputs 517A, 517B. It is noted that the receiver-side IC die 508 includes two mechanisms for maintaining low-noise signals at the die 508: (i) the diode 520 and the resistor 521 lower noise on the power rail 512 and thus reduce an amount of noise that is coupled to the first and second signals from the power rail 512, and (ii) the reference voltage generation scheme filters the first and second signals via the subtraction operation to remove noise that is coupled to the signals.

Figure 5:
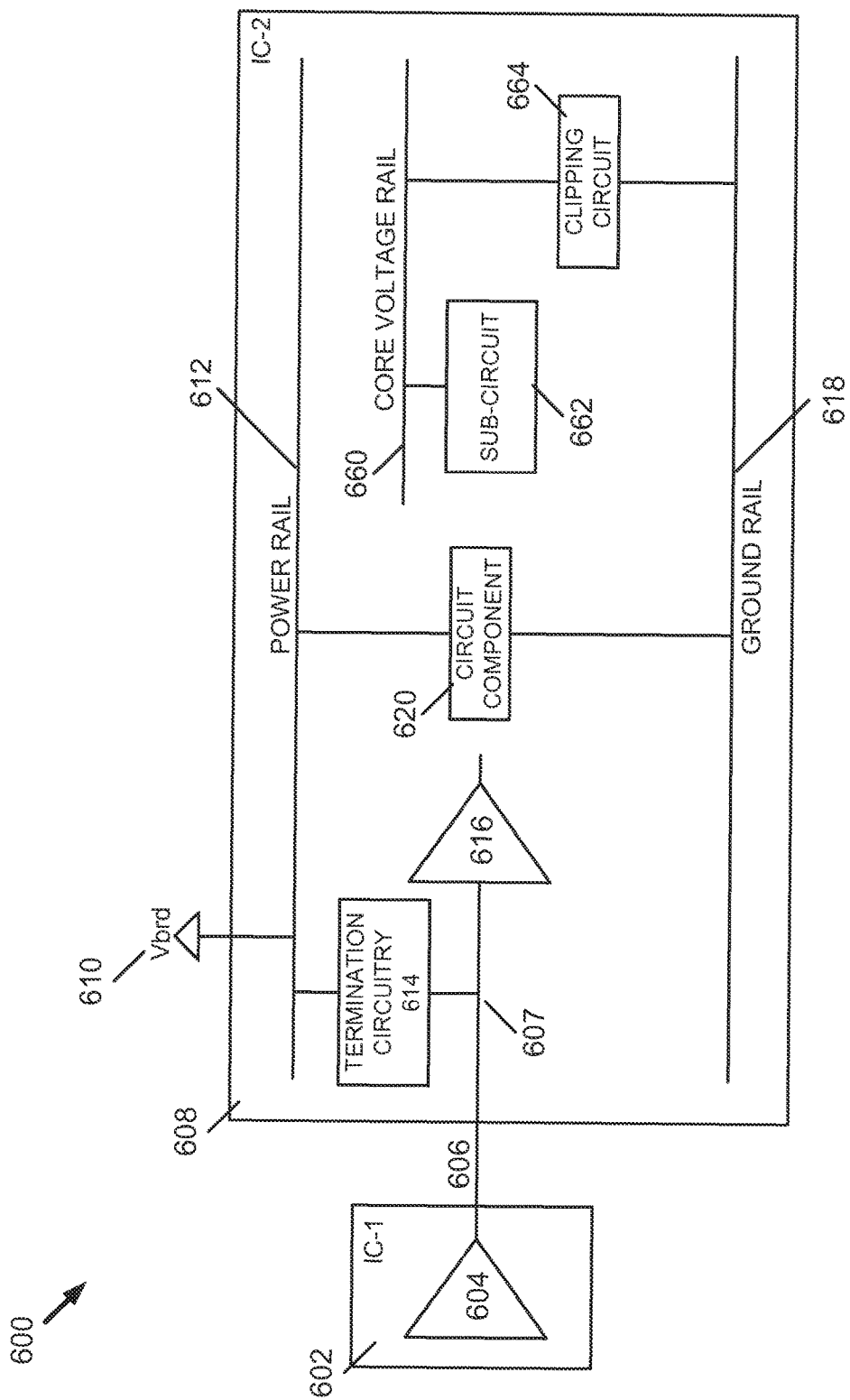
FIG. 5 is a block diagram depicting a receiver-side IC die including a core voltage rail and a clipping circuit configured to bleed off a portion of current on the core voltage rail in accordance with an embodiment of the disclosure.

FIG. 5 is a block diagram depicting a receiver-side IC die 608 including a core voltage rail 660 and a clipping circuit 664 configured to bleed off a portion of current on the core voltage rail 660 in accordance with an embodiment of the disclosure. An IC die may include multiple voltage rails. In the embodiment of the disclosure illustrated in FIG. 5, the IC die 608 includes a power rail 612 and the core voltage rail 660. The power rail 612 is configured to provide an operating voltage to various components of the die 608 and is coupled to a power supply voltage $V_{brd}$ 610 of an off-die PCB. The core voltage rail 660 is configured to provide an operating voltage to a sub-circuit 662 of the IC die 608 and/or other components of the die 608.

Noise can form on the power rail 612 due to toggling of a signal generated by a driver 604 of a trans side IC die 602. As illustrated in FIG. 5, the IC die 608 receives the signal via a transmission line 606 that is coupled to the power rail 612 via termination circuitry 614. Specifically, the signal is received at an input node 607 of the IC die 608, with the input node 607 being coupled to an input terminal of a receiver 616. To suppress coupling of noise from the power rail 612 to the received signal via the termination circuitry 614, the IC die 608 includes a circuit component 620. The circuit component 620 is coupled between the power rail 612 and a ground rail 618 of the IC die 608 and may include one or more active and/or passive electrical circuit components for suppressing a coupling of noise from the power rail 612 to the received signal. Features of the circuit component 620 are described above with reference to FIGS. 1A-4. For example, the circuit component 620 of FIG. 5 may be implemented using the circuit component 120 of FIG. 1A, the diode 220 and resistor 221 of FIG. 2, the diode 320 and resistor 321 of FIG. 3, the diode 520 and resistor 521 of FIG. 4, or other suitable active or passible components.

Noise can also form on the core voltage rail 660. The noise on the core voltage rail 660 may take various forms, including resonance noise. The resonance noise causes a voltage on the core voltage rail 660 to oscillate between maximum and minimum voltages at a specific frequency or multiple different frequencies, with the oscillating voltages including sections that exceed a second high voltage threshold. In an embodiment of the disclosure, to suppress the noise on the core voltage rail 660, the IC die 608 includes the clipping circuit 664 coupled between the core voltage rail 660 and the ground rail 618.

The clipping circuit 664 is configured to bleed off a portion of current on the core voltage rail 660 based on a determination that the voltage on the core voltage rail 660 meets or exceeds the second high voltage threshold. In an embodiment where the clipping circuit 664 is implemented using passive circuitry, the determination includes the voltage on the core voltage rail 660 meeting or exceeding the second high voltage threshold. The bleeding off of the portion of the current lowers the voltage on the core voltage rail 660 to a voltage that is below the second high voltage threshold, thus reducing the noise on the core voltage rail 660. The clipping circuit 664 is further configured to bleed of a smaller portion of the current on the core voltage rail 660 based on a determination that the voltage on the core voltage rail 660 is less than the second high voltage threshold. When the smaller portion of the current is bled off of the core voltage rail 660, the voltage on the core voltage rail 660 is not significantly affected. Thus, the clipping circuit 664 does not operate continuously to regulate the voltage on the core voltage rail 660 but rather only operates to lower the voltage in situations where the voltage has exceeded the second high voltage threshold.

In an embodiment of the disclosure, the clipping circuit 664 is coupled to the core voltage rail 660 at a location of the core voltage rail 660 where it is anticipated that resonance noise will develop. In another embodiment of the disclosure, multiple clipping circuits similar to the clipping circuit 664 are coupled to the core voltage rail 660 at locations of the core voltage rail 660 where it is anticipated that resonance noise will develop. The clipping circuit 664 may include one or more passive electrical circuit components and/or one or more active electrical circuit components for bleeding off the current from the core voltage rail 660. In an embodiment of the disclosure, the clipping circuit 664 includes a diode and a resistor coupled in series to the core voltage rail 660. In an embodiment of the disclosure, the sub-circuit 662 that receives the voltage from the core voltage rail 660 is a central processing unit (CPU). Current surges of the CPU may cause high noise on the power rail 660. In an embodiment to the disclosure, the clipping circuit 664 is integrated into the chip 608. In this embodiment, the clipping circuit 664 may be integrated into the chip 608 regardless of whether the circuit component 620 is integrated into the chip 608 or not. Further, although the example of FIG. 5 depicts the chip 608 including both the circuit component 620 and the clipping circuit 664, in other examples, the chip 608 includes the clipping circuit 664 but does not include the circuit component 620. In these other examples, noise on the core voltage rail 660 is suppressed by the clipping circuit 664, and no corresponding noise suppression mechanism may operate to suppress noise on the power rail 612.

Figure 6:
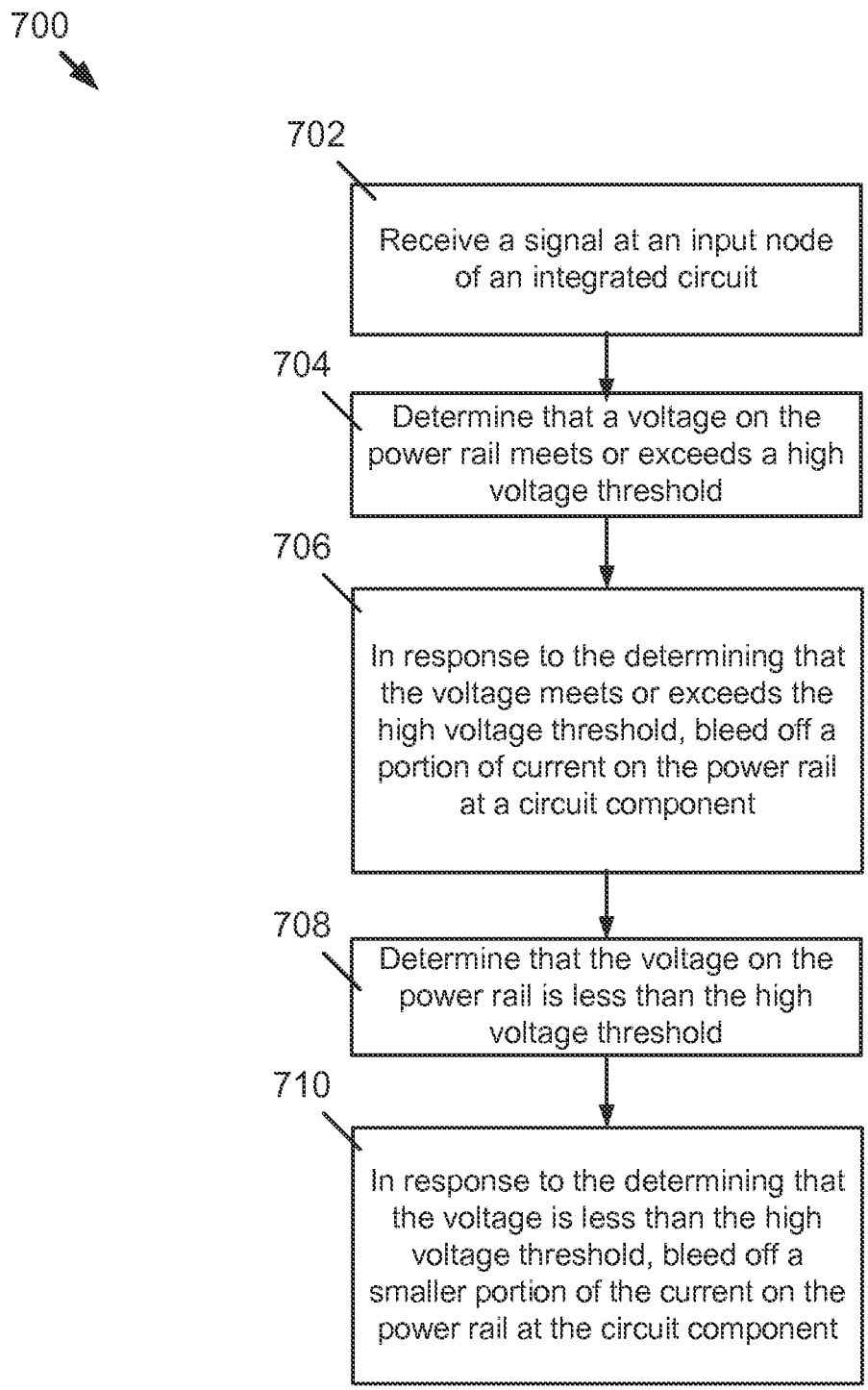
FIG. 6 is a flow diagram depicting steps of a method in accordance with an embodiment of the disclosure.

FIG. 6 is a flow diagram 700 depicting steps of a method in accordance with an embodiment of the disclosure. At 702, a signal is received at an input node of an integrated circuit. The integrated circuit includes termination circuitry configured to electrically couple the input node to a power rail of the integrated circuit. At 704, a voltage on the power rail is determined to meet or exceed a high voltage threshold. The determination includes, in passive circuitry, the voltage on the power rail meeting or exceeding the high voltage threshold. At 706, in response to the determining that the voltage meets or exceeds the high voltage threshold, a portion of current on the power rail is bled off at a circuit component. At 708, the voltage on the power rail is determined to be less than the high voltage threshold. At 710, in response to the determining that the voltage is less than the high voltage threshold, a smaller portion of the current on the power rail is bled off at the circuit component.

This application uses examples to illustrate the invention. The patentable scope of the invention may include other examples.

What is claimed is:

1. An integrated circuit comprising:
   an input node configured to receive a signal via a transmission line;
   termination circuitry configured to electrically couple the input node to a power rail of the integrated circuit; and a circuit component comprising a diode and a resistor that are connected in series from the power rail to a ground rail, the diode having an anode directly connected to the power rail and a cathode directly connected to the resistor, and being configured to (i) bleed off a portion of current from the power rail when a voltage on the power rail meets or exceeds a high voltage threshold to reduce noise on the power rail, and (ii) bleed off a smaller portion of the current from the power rail when the voltage on the power rail is less than the high voltage threshold, wherein the smaller portion is greater than zero; and wherein the integrated circuit is configured such that a voltage between the diode and the resistor is not used as an input or output for another electrical component.

2. The integrated circuit of claim 1, wherein the circuit component comprises a first terminal that is directly connected to the power rail and a second terminal that is directly connected to a ground rail of the integrated circuit.

3. The integrated circuit of claim 1, wherein the circuit component is configured to bleed off an unregulated quantity of current that is significantly greater when the voltage on the power rail meets or exceeds the high voltage threshold as compared to when the voltage on the power rail is less than the high voltage threshold.

4. The integrated circuit of claim 3, wherein the circuit component is configured to bleed off the unregulated quantity of current to lower the voltage on the power rail when the voltage meets or is above the high voltage threshold, and wherein the electrical circuit component does not significantly affect the voltage on the power rail when the voltage is less than the high voltage threshold.

5. The integrated circuit of claim 1 comprising:
a second input node configured to receive a second signal via a second transmission line; and
second termination circuitry configured to electrically couple the second input node to the power rail of the integrated circuit,
wherein an amount of the current that is bled off by the circuit component is optimized to suppress noise on the power rail, the noise being generated by simultaneously-toggling switching elements coupled to the power rail via the transmission line, the second transmission line, and the termination circuitry, and
wherein the simultaneously-toggling switching elements include (i) a first off-die driver component that transmits the signal to the integrated circuit via the transmission line, and (ii) a second off-die driver component that transmits the second signal to the integrated circuit via the second transmission line.

6. The integrated circuit of claim 1, wherein the power rail of the integrated circuit is coupled to a power supply voltage of an off-die printed circuit (PC) board, the PC board providing a power supply to the integrated circuit via the power supply voltage.

7. The integrated circuit of claim 1, wherein the circuit component is configured to bleed off the portion of the current on the power rail to suppress resonance on the power rail by lowering the voltage on the power rail, and wherein the suppression of the resonance on the power rail suppresses a signal resonance waveform on the signal in the integrated circuit.

8. The integrated circuit of claim 1 comprising:
a core voltage rail configured to provide an operating voltage to a sub-circuit of the integrated circuit; and
a second circuit component coupled between the core voltage rail and a ground rail, the second circuit component being configured to:
bleed off a portion of current on the core voltage rail based on a voltage on the core voltage rail meeting or exceeding a second high voltage threshold; and
bleed off a smaller portion of the current on the core voltage rail based on the voltage on the core voltage rail being less than the second high voltage threshold.

9. The integrated circuit of claim 8, wherein the sub-circuit comprises a central processing unit (CPU).

10. The integrated circuit of claim 1, wherein the circuit component is configured to lower the voltage on the power rail to an unregulated voltage that is below the high voltage threshold.

11. A system comprising:
a transmission-side integrated circuit including a driver circuit component configured to generate the signal; and
an integrated circuit according to claim 1, wherein the transmission line couples the driver circuit component to the input node.

12. An integrated circuit comprising:
a core voltage rail configured to provide an operating voltage to a sub-circuit of the integrated circuit; and
a circuit component comprising a diode and a resistor that are connected in series from the core voltage rail to a ground rail, the diode having an anode directly connected to the core voltage rail and a cathode directly connected to the resistor, the circuit component being configured to:
bleed off a portion of current on the core voltage rail when a voltage on the core voltage rail meets or exceeds a high voltage threshold to reduce noise on the core voltage rail; and
bleed off a smaller portion of the current on the core voltage rail when the voltage on the core voltage rail is less than the high voltage threshold, wherein the smaller portion of the current is greater than zero; and
wherein the integrated circuit is configured such that a voltage between the diode and the resistor is not used as an input or output for another electrical component.

13. A method comprising:
receiving a signal at an input node of an integrated circuit, the integrated circuit including termination circuitry configured to electrically couple the input node to a power rail of the integrated circuit;
in response to a voltage on the power rail meeting or exceeding a high voltage threshold, bleeding off a portion of current on the power rail at a circuit component to reduce noise on the power rail; and
in response to the voltage being less than the high voltage threshold, bleeding off a smaller portion of the current on the power rail at the circuit component, wherein the smaller portion of the current is greater than zero;
wherein the bleeding off of the portion and the bleeding off of the smaller portion are performed by the circuit component comprising a diode and a resistor that are connected in series from the power rail to a ground rail, the diode having an anode directly connected to the power rail and a cathode directly connected to the resistor; and wherein the integrated circuit is configured such that a voltage between the diode and the resistor is not used as an input or output for another electrical component.

14. The method of claim 13, wherein the portion of the current bled off of the power rail is a first unregulated quantity of current that is significantly greater than the smaller portion of the current, the smaller portion of the current being a second unregulated quantity of current bled off of the power rail.

15. The method of claim 14, wherein the bleeding off of the first unregulated quantity of current lowers the voltage on the power rail when the voltage meets or is above the high voltage threshold, and wherein the voltage on the power rail is not significantly affected when the second unregulated quantity of current is bled off of the power rail.

16. The method of claim 13 comprising:
receiving a second signal at a second input node of the integrated circuit, the integrated circuit including second termination circuitry configured to electrically couple the second input node to the power rail of the integrated circuit, wherein an amount of the current that is bled off by the circuit component is optimized to suppress noise on the power rail, the noise being generated by simultaneously-toggling switching elements coupled to the power rail via the termination circuitry and the second termination circuitry.

17. The method of claim 13, wherein the bleeding off of the portion of the current on the power rail suppresses resonance on the power rail by lowering the voltage on the power rail, and wherein the suppression of the resonance on the power rail suppresses a signal resonance waveform on the signal in the integrated circuit.

18. The method of claim 13 comprising:
providing an operating voltage to a sub-circuit of the integrated circuit using a core voltage rail;
determining that a voltage on the core voltage rail meets or exceeds a second high voltage threshold;
in response to the determining that the voltage on the core voltage rail meets or exceeds the second high voltage threshold, bleeding off a portion of current on the core voltage rail at a second circuit component;
determining that the voltage on the core voltage rail is less than the second high voltage threshold; and
in response to the determining that the voltage on the core voltage rail is less than the second high voltage threshold, bleeding off a smaller portion of the current on the core voltage rail at the second circuit component.

19. The method of claim 13, wherein the bleeding off the portion of current on the power rail at the circuit component lowers the voltage on the power rail to an unregulated voltage that is below the high voltage threshold.

* * * * *